US009041486B2

(12) United States Patent
Tsurunari et al.

(10) Patent No.: US 9,041,486 B2
(45) Date of Patent: May 26, 2015

(54) LADDER TYPE SURFACE ACOUSTIC WAVE FILTER AND DUPLEXER USING SAME

(75) Inventors: Tetsuya Tsurunari, Osaka (JP); Rei Goto, Osaka (JP); Hiroyuki Nakamura, Osaka (JP)

(73) Assignee: SKYWORKS PANASONIC FILTER SOLUTIONS JAPAN CO., LTD, Osaka (JP)

( * ) Notice: Subject to any disclaimer, the term of this patent is extended or adjusted under 35 U.S.C. 154(b) by 752 days.

(21) Appl. No.: 13/378,129

(22) PCT Filed: Jun. 15, 2010

(86) PCT No.: PCT/JP2010/003948

§ 371 (c)(1), (2), (4) Date: Dec. 14, 2011

(87) PCT Pub. No.: WO2010/146826

PCT Pub. Date: Dec. 23, 2010

(65) Prior Publication Data

US 2012/0086521 A1 Apr. 12, 2012

(30) Foreign Application Priority Data

Jun. 18, 2009 (JP) ................................ 2009-144897

(51) Int. Cl.
*H03H 9/72* (2006.01)
*H03H 9/64* (2006.01)
*H03H 9/02* (2006.01)

(52) U.S. Cl.
CPC ......... *H03H 9/6483* (2013.01); *H03H 9/02944* (2013.01); *H03H 9/725* (2013.01); *H03H 9/02834* (2013.01)

(58) Field of Classification Search
CPC . H03H 9/6483; H03H 9/02834; H03H 9/725; H03H 9/02944
USPC ........... 333/133, 193–196; 310/313 B, 313 D
See application file for complete search history.

(56) References Cited

U.S. PATENT DOCUMENTS 6,989,723 B2 * 1/2006 Komuro et al. ............... 333/133
7,741,931 B2 6/2010 Matsuda (Continued)

FOREIGN PATENT DOCUMENTS

JP 2000-196408 A 7/2000
JP 2000196409 A 7/2000

(Continued)

OTHER PUBLICATIONS

F.S. Hickernell et al.; "The Surface Acoustic Wave Propagation Characteristics of 64 degree Y-X LiNbO3 and 36 degree Y-X LiTaO3 Substrates with Thin-Film SiO2"; 1995 IEEE Ultrasonics Symposium, 1995, pp. 345-348.*

(Continued)

*Primary Examiner* — Barbara Summons
(74) *Attorney, Agent, or Firm* — Lando & Anastasi, LLP

(57) ABSTRACT

An object of the present invention is to improve the passing characteristic at high temperature in a ladder-type elastic wave filter and a duplexer including the filter. The ladder-type elastic wave filter of the present invention includes a piezoelectric substrate, a first series elastic-wave resonator formed on the piezoelectric substrate and connected in series between the input and output terminals of the filter, a parallel elastic-wave resonator formed on the piezoelectric substrate and connected in parallel between the series elastic-wave resonator and the ground terminal, and a dielectric film formed on the piezoelectric substrate so as to cover the first series elastic-wave resonator. The piezoelectric substrate is formed of a material with a negative temperature coefficient. The dielectric film is formed of a material with a positive temperature coefficient and its film thickness is formed thicker than that with which the frequency-temperature coefficient of the first series elastic-wave resonator becomes 0.

20 Claims, 10 Drawing Sheets

(56) References Cited

U.S. PATENT DOCUMENTS

| | | | | |
|---|---|---|---|---|
| 2002/0000898 | A1 | 1/2002 | Takamine | |
| 2002/0038989 | A1 * | 4/2002 | Larson, III | 310/330 |
| 2003/0006859 | A1 | 1/2003 | Taniguchi | |
| 2003/0062970 | A1 | 4/2003 | Ouchi et al. | |
| 2003/0151329 | A1 * | 8/2003 | Kadota et al. | 310/313 A |
| 2006/0181366 | A1 | 8/2006 | Taniguchi | |
| 2007/0152774 | A1 | 7/2007 | Nakanishi | |
| 2008/0074212 | A1 * | 3/2008 | Matsuda et al. | 333/195 |
| 2013/0162368 | A1 * | 6/2013 | Tsurunari et al. | 333/133 |

FOREIGN PATENT DOCUMENTS

| | | | |
|---|---|---|---|
| JP | 2002-84163 | A | 3/2002 |
| JP | 2002330054 | A | 11/2002 |
| JP | 2003-152502 | A | 5/2003 |
| JP | 2008079227 | A | 4/2008 |
| WO | WO 2005076473 | A1 | 8/2005 |
| WO | WO 2005088835 | A1 | 9/2005 |

OTHER PUBLICATIONS

International Application Serial No. PCT/JP2010/003948, International Search Report mailed Sep. 21, 2010, 2 pgs.

State Intellectual Property Office of People's Republic of China Search Report for Application No. 201080026908.X dated Oct. 28, 2013.

* cited by examiner 10
11
11a
11b
11c
11d
11e
11f
11g
11h
11i
11j
12
12a
12b
12c
13 passing characteristic (dB)

passing characteristic (dB)

passing characteristic (dB)

70
71
72
11a
11b
11j
12b
12c
13
92a
71c
71d
71e
71f
71g
71h
71i 90
91
92
11a
11b
11j
13
91c
91d
91e
91f
91g
91h
91i
92a
92b
92c
92d
92e
92f
92g
92h
92i
92j

LADDER TYPE SURFACE ACOUSTIC WAVE FILTER AND DUPLEXER USING SAME

This Application is a U.S. National Phase Application of PCT International Application PCT/JP2010/003948.

TECHNICAL FIELD

The present invention relates to a ladder-type elastic wave filter and a duplexer including the filter.

BACKGROUND ART

As shown in FIG. 10, conventional ladder-type elastic wave filter 100 includes piezoelectric substrate 101, series elastic-wave resonator 102*a* formed on piezoelectric substrate 101, dielectric film 103*a* formed on piezoelectric substrate 101 so as to cover series elastic-wave resonator 102*a*, parallel elastic-wave resonator 102*b* formed on piezoelectric substrate 101, and dielectric film 103*b* formed on piezoelectric substrate 101 so as to cover parallel elastic-wave resonator 102*b*.

In this configuration, film thickness Ha of dielectric film 103*a* is formed so that the frequency-temperature coefficient of series elastic-wave resonator 102*a* becomes 0. Film thickness Hb of dielectric film 103*b* is formed thinner than film thickness Ha so that the frequency-temperature coefficient of parallel elastic-wave resonator 102*b* becomes 0.

Here, there is known patent literature 1 for example as information on prior art documents related to the invention.

In a conventional ladder-type elastic wave filter, its ohmic loss increases at high temperature, which causes its passing characteristic to deteriorate.

CITATION LIST

Patent Literature

PTL 1 Japanese Patent Unexamined Publication No. 2008-79227

SUMMARY OF THE INVENTION

Under the circumstances, an object of the present invention is to improve the passing characteristic at high temperature. A ladder-type elastic wave filter of the present invention includes a piezoelectric substrate, a first series elastic-wave resonator formed on the piezoelectric substrate and connected in series between the input and output terminals of the filter, a parallel elastic-wave resonator formed on the piezoelectric substrate and connected in parallel between the series elastic-wave resonator and the ground terminal, and a dielectric film formed on the piezoelectric substrate so as to cover the first series elastic-wave resonator. The piezoelectric substrate is formed of a material with a negative temperature coefficient. The dielectric film is formed of a material with a positive temperature coefficient and its film thickness is formed thicker than that with which the frequency-temperature coefficient of the first series elastic-wave resonator becomes 0.

With this configuration, the passband of the series elastic-wave resonator shifts to the high frequency side as the temperature rises. This prevents the passing characteristic at the right shoulder of the passband from deteriorating even if the ohmic loss increases at high temperature.

A ladder-type elastic wave filter of the present invention includes a piezoelectric substrate, a series elastic-wave resonator formed on the piezoelectric substrate and connected in series between the input and output terminals of the filter, a first parallel elastic-wave resonator formed on the piezoelectric substrate and connected in parallel between the series elastic-wave resonator and the ground terminal, and a dielectric film formed on the piezoelectric substrate so as to cover the first parallel elastic-wave resonator. The piezoelectric substrate is formed of a material with a negative temperature coefficient. The dielectric film is formed of a material with a positive temperature coefficient and its film thickness is formed thinner than that with which the frequency-temperature coefficient of the first parallel elastic-wave resonator becomes 0.

With this configuration, the passband of the parallel elastic-wave resonator shifts to the low frequency side as the temperature rises. This prevents the passing characteristic at the left shoulder of the passband from deteriorating even if the ohmic loss increases at high temperature.

DESCRIPTION OF EMBODIMENTS

Hereinafter, a description is made of some embodiments of the present invention with reference to the related drawings. The present invention is not limited by these embodiments.

First Exemplary Embodiment

Figure 1:
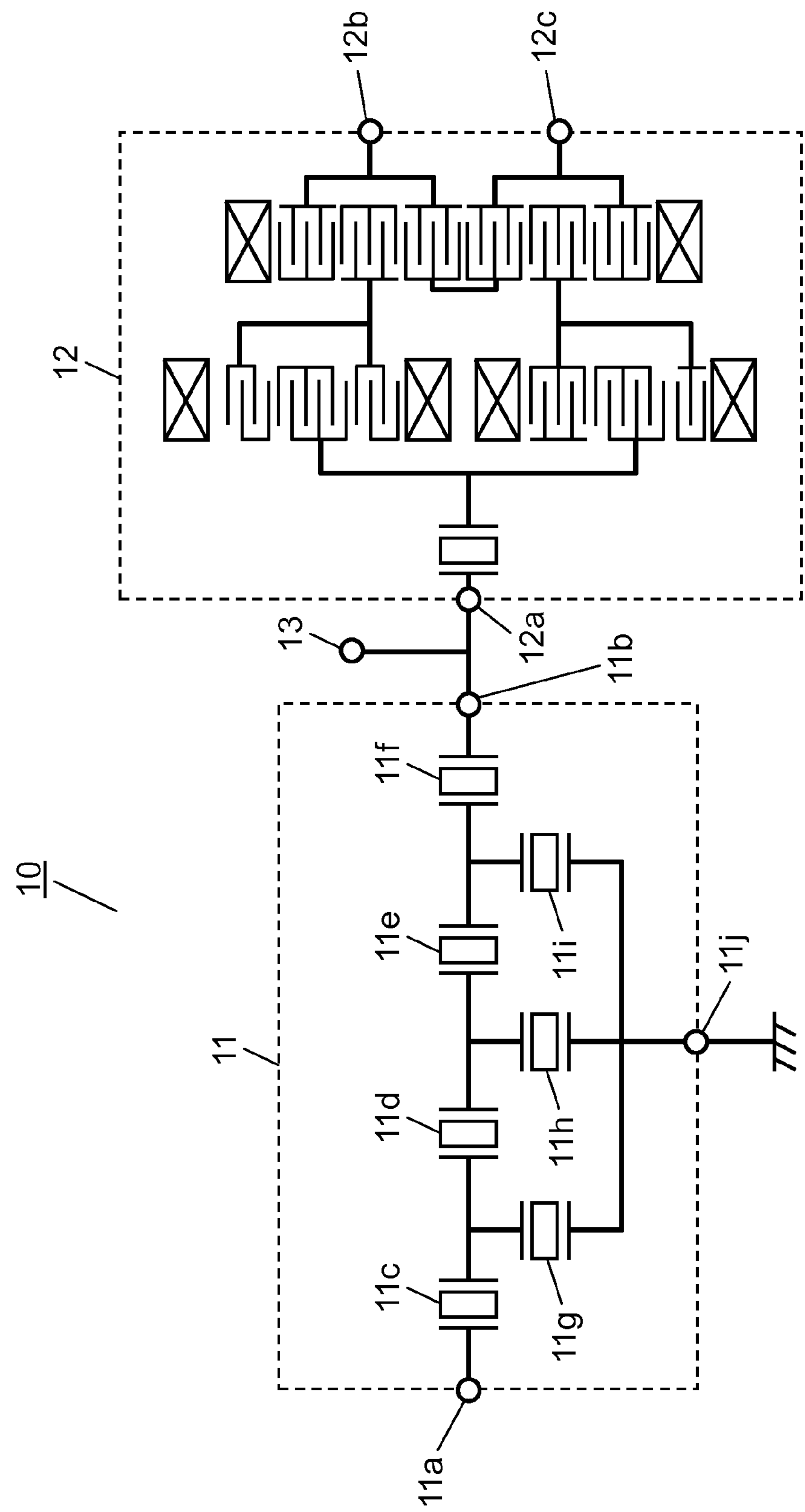
FIG. 1 is a block diagram of a duplexer according to a first exemplary embodiment.

FIG. 1 is a block diagram of duplexer 10 for Band 2 complying with the WCDMA standard, according to the first embodiment.

Duplexer 10 includes transmission filter 11 for passing signals in the transmission band (1.85 GHz through 1.91

GHz) for Band 2, reception filter 12 for passing signals in the reception band (1.93 GHz through 1.99 GHz) for Band 2, and antenna terminal 13 connected to output terminal 11*b* of transmission filter 11 and to input terminal 12*a* of reception filter 12.

Transmission filter 11 includes four series elastic-wave resonators 11*c*, 11*d*, 11*e*, and 11*f* formed on a piezoelectric substrate (not shown) and connected in series between input terminal 11*a* and output terminal 11*b*. Here, series elastic-wave resonator 11*e* with the highest capacitance is assumed to be a first series elastic-wave resonator; the others are second series elastic-wave resonators. Transmission filter 11 includes three parallel elastic-wave resonators 11*g*, 11*h*, and 11*i* connected in parallel between series elastic-wave resonators 11*c* through 11*f* and ground terminal 11*j*.

Figure 2:
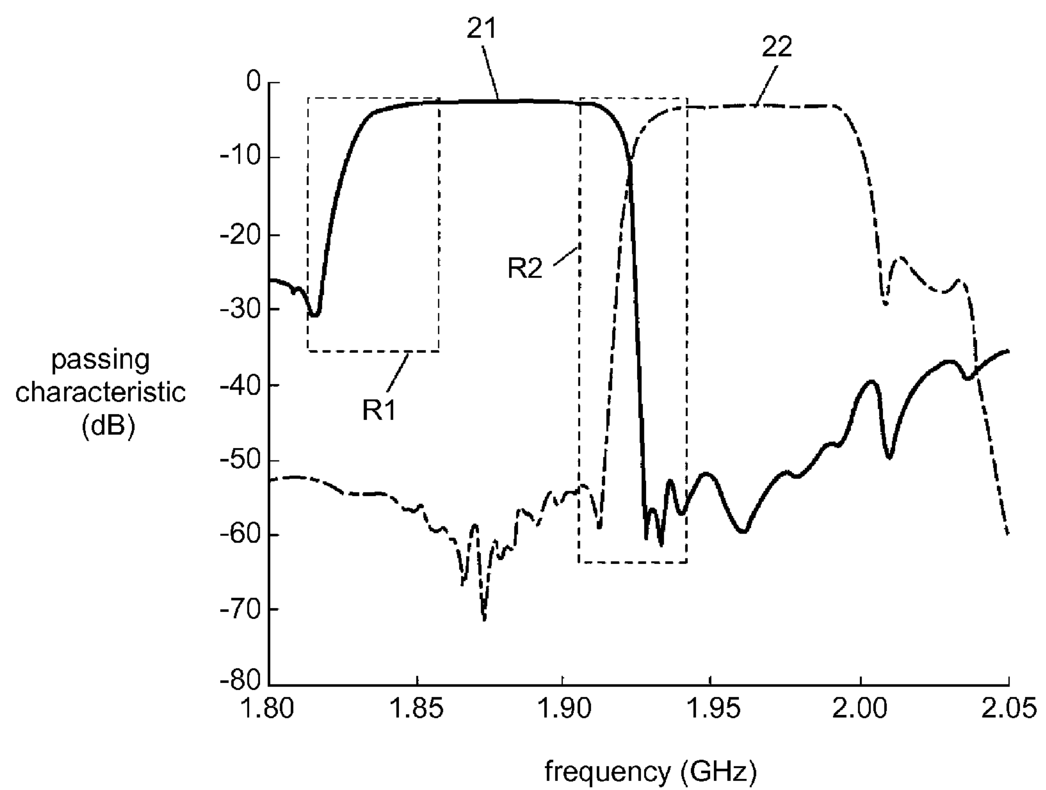
FIG. 2 illustrates a passing characteristic of the duplexer according to the first exemplary embodiment.

FIG. 2 is a graph with its horizontal axis representing frequency (GHz); its vertical axis representing passing characteristic (dB), showing transmission characteristic 21 of transmission filter 11 and reception characteristic 22 of reception filter 12.

Transmission filter 11 needs to pass signals in the transmission band with a low loss and simultaneously to suppress signals in the reception band adequately. Meanwhile, reception filter 12 needs to pass signals in the reception band with a low loss and simultaneously to suppress signals in the transmission band adequately.

In transmission filter 11, the interval (crossband) between the transmission band (1.85 GHz through 1.91 GHz) and the reception band (1.93 GHz through 1.99 GHz) for Band 2 of the WCDMA standard is as extremely narrow as 20 MHz, which is a problem from the viewpoint of adequately suppressing signals in the reception band. Accordingly, attenuation in the reception band needs to be achieved by making right shoulder R2 of transmission characteristic 21 steep adequately. In transmission characteristic 21, the steepness (the difference between the frequency at which the passing characteristic exhibits −3 dB and that the passing characteristic first exhibits an attenuation pole) of R2 is 15 MHz, which is larger than the steepness (22 MHz) of left shoulder R1 of the transmission band.

Meanwhile, the characteristic at right shoulder R2 of transmission characteristic 21 is important also from the aspect of reducing loss in the passband of transmission filter 11. In transmission characteristic 21, the passing characteristic exhibits 1.9 dB at the low-frequency (1.85 GHz) side of the transmission band, while the passing characteristic exhibits 2.4 dB at the high-frequency (1.91 GHz) side of the transmission band. This is because the steepness at right shoulder R2 of the transmission band is made larger than that at left shoulder R1. Thus in transmission filter 11, the passing characteristic at right shoulder R2 of transmission characteristic 21 is a bottle neck for the passing characteristic of the entire transmission band.

Here, transmission characteristic 21 of transmission filter 11 varies depending on temperature. As shown in FIG. 1, transmission filter 11 includes series elastic-wave resonators 11*c*, 11*d*, 11*e*, and 11*f* and parallel elastic-wave resonators 11*g*, 11*h*, and 11*i*, each equipped with a comb-teeth electrode primarily containing a metal such as aluminum and copper on a piezoelectric substrate. Consequently, the resistivity of a comb-teeth electrode increases as the temperature rises, thereby increasing a loss in transmission characteristic 21. Accordingly, transmission filter 11 needs to be designed so that the loss at the high-frequency (1.91 GHz) side of the transmission characteristic satisfies intended design specifications at the upper-limit temperature in the guaranteed temperature range.

In transmission filter 11 according to the first embodiment of the present invention, right shoulder R2 of the transmission band is shifted to the high-frequency side as the temperature rises by making positive the frequency-temperature characteristic of series elastic-wave resonators 11*c*, 11*d*, 11*e*, and 11*f*, to prevent a loss due to the ohmic loss in a comb-teeth electrode from increasing.

Even with this configuration, the attenuation amount in the stop band is less likely to be affected. This is because, although right shoulder R2 shifts to the high-frequency side as the temperature rises, the ohmic loss increases simultaneously.

At low temperature, meanwhile, the ohmic loss in a comb-teeth electrode decreases although right shoulder R2 shifts to the low-frequency side, which prevents a loss at the high-frequency side (1.91 GHz) of the transmission band from increasing.

Examples of how to adjust the frequency-temperature characteristic of transmission filter 11 include adjusting the thickness of a dielectric film formed on a piezoelectric substrate included in transmission filter 11 so as to cover series elastic-wave resonators 11*c*, 11*d*, 11*e*, and 11*f*.

Figure 3A:
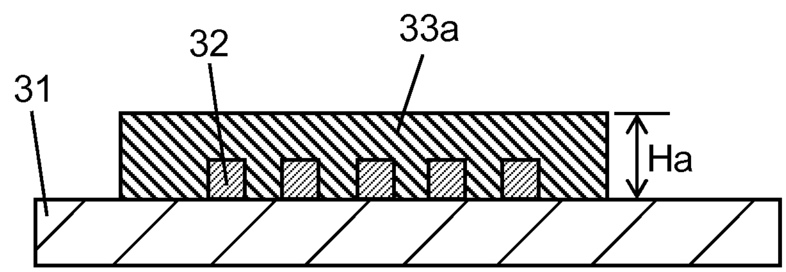
FIG. 3A illustrates a dielectric film covering an elastic-wave resonator.
Figure 3B:
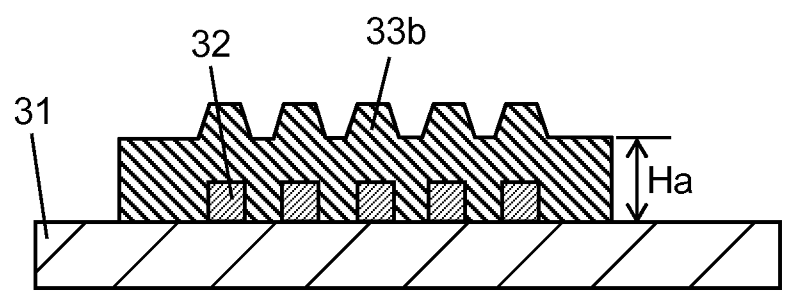
FIG. 3B illustrates a dielectric film covering the elastic-wave resonator.

A description is made of the thickness of a dielectric film using FIGS. 3A and 3B. FIGS. 3A and 3B illustrate a dielectric film covering an elastic-wave resonator. In FIG. 3A, series elastic-wave resonator 32 is formed on piezoelectric substrate 31 made of lithium tantalate or lithium niobate, for example. Dielectric film 33*a* is formed on piezoelectric substrate 31 so as to cover series elastic-wave resonator 32. The film thickness of dielectric film 33*a* is Ha. Here, as shown in FIG. 3B, dielectric film 33*a* may be dielectric film 33*b* with a protrusion part formed on its top surface. Such a protrusion shape suppresses unnecessary spurious emission such as Rayleigh-mode one.

Piezoelectric substrate 31 made of lithium tantalate or lithium niobate for example typically has a negative temperature characteristic in the frequency-temperature characteristic. Hence, the frequency-temperature characteristic of an elastic wave excited by series elastic-wave resonator 32 can be adjusted by forming a dielectric film (e.g. silicon dioxide) having a positive temperature characteristic with a given film thickness.

Figure 4:
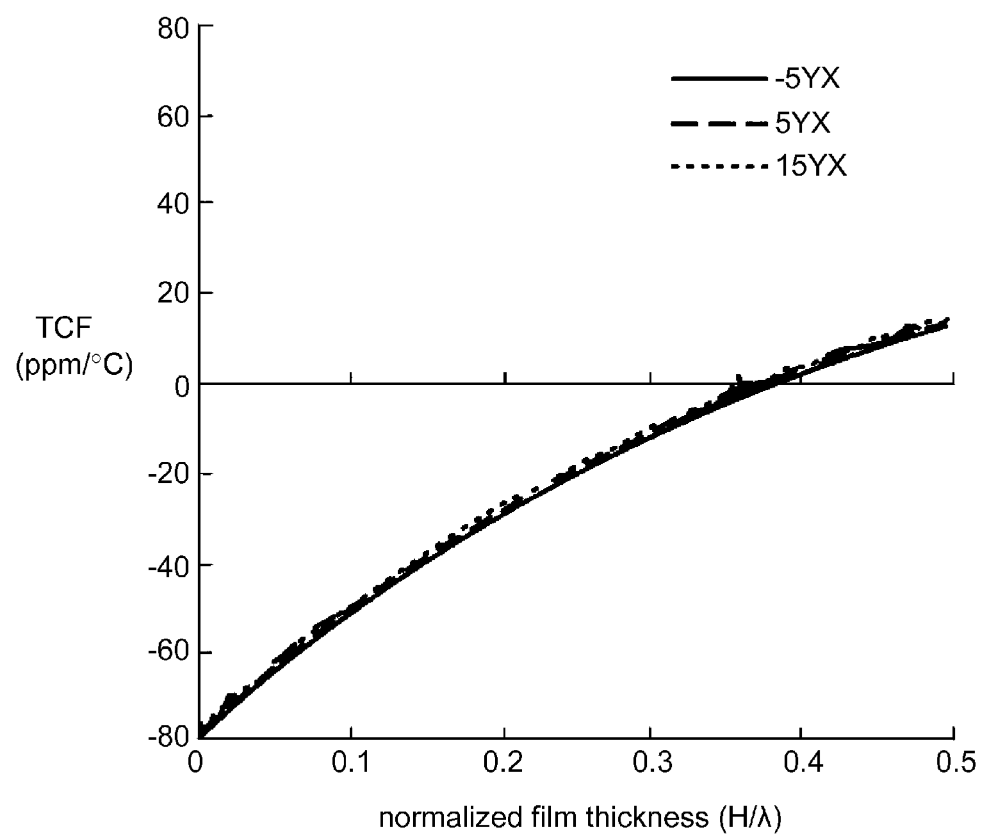
FIG. 4 shows a relationship between a thickness of the dielectric film covering the elastic-wave resonator and a frequency-temperature characteristic.

FIG. 4 shows, for piezoelectric substrate 31 made of lithium niobate, the relationship between a normalized film thickness ($H/\lambda$) determined by dividing film thickness H of a dielectric film (silicon dioxide) by wavelength $\lambda$; and the frequency-temperature characteristic (TCF: temperature coefficient of frequency) (ppm/° C.) of an elastic wave excited by series elastic-wave resonator 32. In FIG. 4, the solid line represents a case of −5YX, where the cut angle of the rotating Y plate of piezoelectric substrate 31 made of lithium niobate is −5°; the broken line, 5YX (5°); and the dotted line, 15YX (15°). As proved from FIG. 4, when silicon dioxide is not formed on piezoelectric substrate 31 for any cut angle ($H/\lambda=0$), the frequency-temperature characteristic is approximately −80 ppm/° C. Instead, the frequency-temperature characteristic is roughly 0 for a normalized film thickness ($H/\lambda$) of silicon dioxide of approximately 0.4.

In this way, for a conventional transmission filter, the thickness of a dielectric film made of such as silicon dioxide adjusted so that the frequency-temperature characteristic is roughly 0 according to the temperature characteristic of piezoelectric substrate 31.

In transmission filter 11 according to the first embodiment of the present invention, however, the thickness of a dielectric film (e.g. silicon dioxide) covering a series elastic-wave resonator is formed thicker than that with which the frequency-temperature characteristic becomes 0 to consciously make the frequency-temperature characteristic positive. Concretely, the film thickness of series elastic-wave resonator 11*c* through 11*f* covering series elastic-wave resonator 11*c* through 11*f* is made thicker than that with which the frequency-temperature characteristic of a dielectric film becomes 0.

Figure 5A:
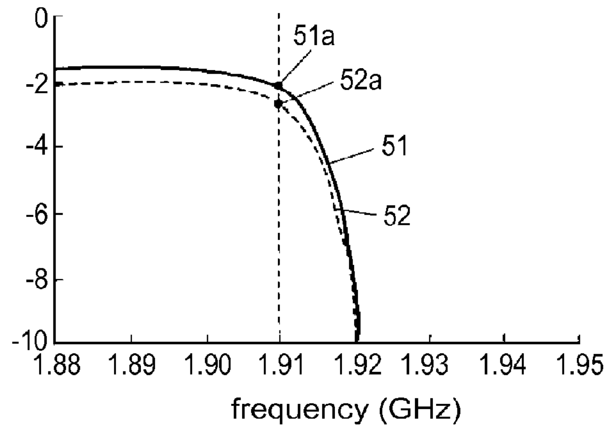
FIG. 5A illustrates a transmission characteristic of a conventional transmission filter.
Figure 5B:
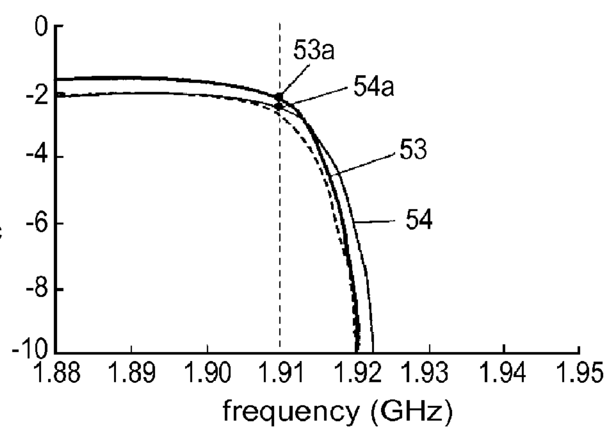
FIG. 5B illustrates a transmission characteristic of a transmission filter according to the first exemplary embodiment.

A description is made of advantages given by the above-described configuration using FIGS. 5A and 5B. FIG. 5A shows transmission characteristic 51 of a conventional transmission filter at room temperature (25° C.), and transmission characteristic 52 of a conventional transmission filter at high temperature (85° C.). Conventional transmission characteristic 52 at high temperature exhibits a greater loss than conventional transmission characteristic 51 at room temperature due to the greater ohmic loss in a comb-teeth electrode. Consequently, the passing characteristic at the high-frequency side of the transmission band is 2.4 dB (point 51*a*) at room temperature; and deteriorates to 2.8 dB (point 52*a*) at high temperature.

FIG. 5B shows transmission characteristic 53 of transmission filter 11 according to the first embodiment at room temperature (25° C.), and transmission characteristic 54 at high temperature (85° C.). Similarly to FIG. 5A, transmission characteristic 54 at high temperature exhibits a greater loss than transmission characteristic 53 at room temperature due to the greater ohmic loss in a comb-teeth electrode. However, series elastic-wave resonators 11*c*, 11*d*, 11*e*, and 11*f* (i.e. first and second series elastic-wave resonators) determining a characteristic at the high-frequency side of the transmission characteristic has a positive frequency-temperature characteristic. In other words, the film thicknesses of dielectric films covering the first and second series elastic-wave resonators are respectively formed thicker than those with which the frequency-temperature characteristic becomes 0, and thus the frequency-temperature characteristic of the series elastic-wave resonators is positive. As a result, transmission characteristic 54 at high temperature shifts closer to the high-frequency side than transmission characteristic 53 at room temperature. Consequently, the passing characteristic at the high-frequency side of the transmission band is 2.4 dB (point 53*a*) at room temperature; and 2.6 dB (point 54*a*) at high temperature. In this way, transmission filter 11 according to the first embodiment is improved in the passing characteristic at high temperature as compared to a conventional transmission filter. In the first embodiment, four series elastic-wave resonators 11*c* through 11*f* are connected in series. However, the number of series elastic-wave resonators is not limited. For example, a composition of only first series elastic-wave resonators provides advantages in the same way. The number of first and second series elastic-wave resonators is not limited to the above-described example.

Figure 5C:
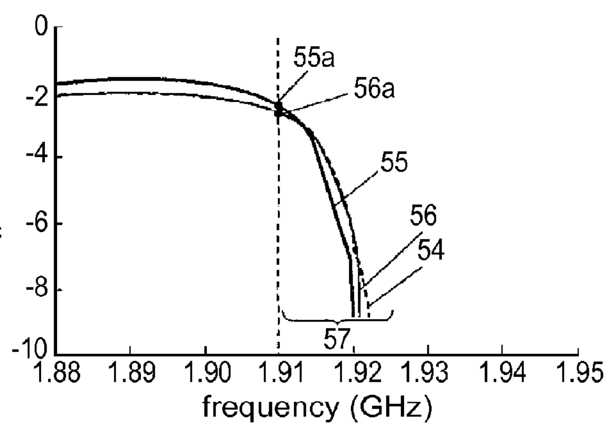
FIG. 5C illustrates a transmission characteristic of a transmission filter according to the first exemplary embodiment.

Next, a description is made of another example according to the first embodiment using FIG. 5C. FIG. 5C shows transmission characteristic 55 at room temperature (25° C.) and transmission characteristic 56 at high temperature (85° C.) in a case where only the thickness of a dielectric film covering series elastic-wave resonator 11*e* (first series elastic-wave resonator) with the highest capacitance out of series elastic-wave resonators 11*c*, 11*d*, 11*e*, and 11*f* included in transmission filter 11 is formed thicker than that with which the frequency-temperature characteristic becomes 0. Here, the capacitance of a resonator is proportional to the product of the cross width of the electrode fingers of a comb-teeth electrode and the number of pairs of the electrode fingers.

In FIG. 5C, transmission characteristic 56 at high temperature has passing characteristic 56*a* at the high-frequency side same as transmission characteristic 54 (shown by the dotted line in FIG. 5C) in FIG. 5B while having an increased attenuation amount in stop band 57.

Figure 6:
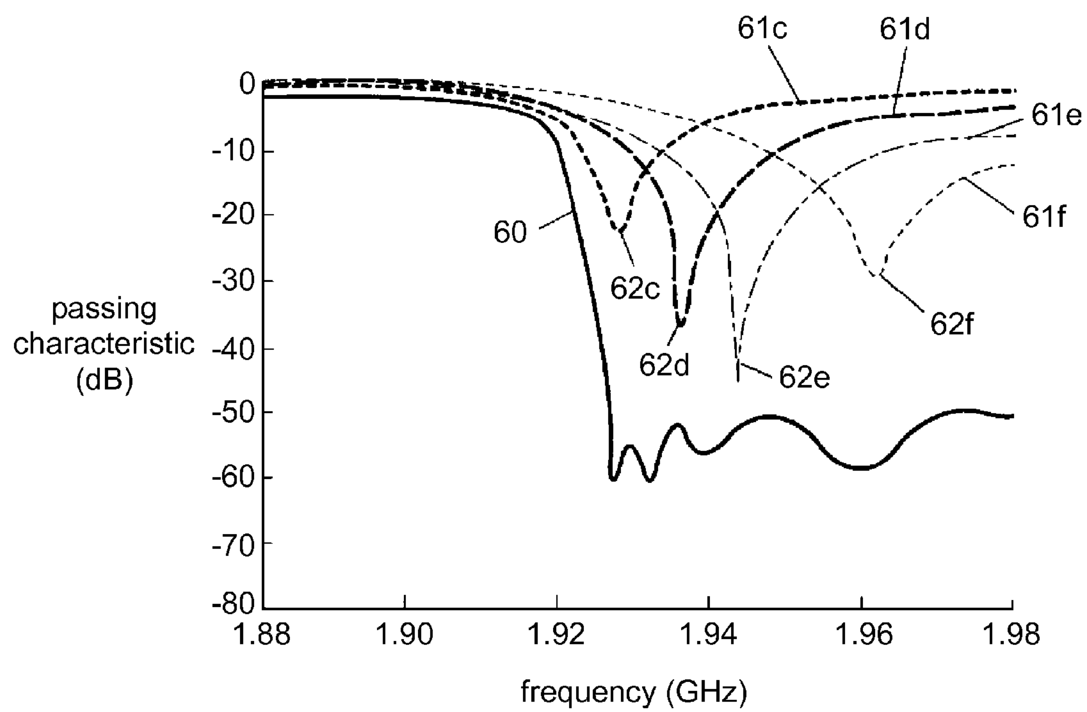
FIG. 6 illustrates the transmission characteristic of the transmission filter according to the first exemplary embodiment.

A detailed description is made of the transmission characteristic of the embodiment shown in FIG. 5C using FIG. 6. Transmission characteristic 60 of FIG. 6 represents that of transmission filter 11. Transmission characteristics 61*c*, 61*d*, 61*e*, and 61*f* respectively represent those of series elastic-wave resonators 11*c*, 11*d*, 11*e*, and 11*f* included in transmission filter 11. As described above, in transmission filter 11, only the thickness of a dielectric film covering series elastic-wave resonator 11*e* (first series elastic-wave resonator) with the highest capacitance is formed thicker than that with which the frequency-temperature characteristic becomes 0. Accordingly, as the temperature rises, antiresonance frequency 62*e* of series elastic-wave resonator 11*e* (first series elastic-wave resonator) shifts to the high-frequency side while antiresonance frequencies 62*c*, 62*d*, and 62*f* of other series elastic-wave resonators 11*c*, 11*d*, and 11*f* (second series elastic-wave resonators) do not shift. The slope of the attenuation characteristic of transmission filter 11 at the high-frequency side varies largely depending on series elastic-wave resonator 11*e* with the highest capacitance. As a result, in the entire transmission characteristic 60 composed of these transmission characteristics 61*c*, 61*d*, 61*e*, and 61*f*, only the right shoulder shifts to the high-frequency side, and the attenuation amount in the stop band is maintained.

In the first embodiment, the description is made assuming that series elastic-wave resonator 11*e* has the highest capacitance out of series elastic-wave resonators 11*c*, 11*d*, 11*e*, and 11*f* included in transmission filter 11, but not limited to this configuration. The following configuration may be used as well. That is, another series elastic-wave resonator has the highest capacitance and only the thickness of a dielectric film covering the series elastic-wave resonator is formed thicker than that with which three frequency-temperature characteristics become 0. There may be plural series elastic-wave resonators (first series elastic-wave resonators) that have the highest capacitance.

Here, the capacitance of an elastic-wave resonator can be adjusted according to the cross width of the electrode fingers of a comb-teeth electrode and the number of pairs of the electrode fingers.

A configuration of a duplexer using transmission filter 11 according to the first embodiment achieves a desired attenuation characteristic and provides a duplexer with reduced deterioration in the transmission characteristic at high temperature.

Transmission filter 11 according to the first embodiment can handle both a surface elastic wave propagating on the surface of piezoelectric substrate 31 and a boundary elastic wave propagating on the boundary surface between media with different velocities of wave propagation.

Second Exemplary Embodiment

One of the features in the second exemplary embodiment is described hereinafter with a difference from the first embodiment.

Figure 7:
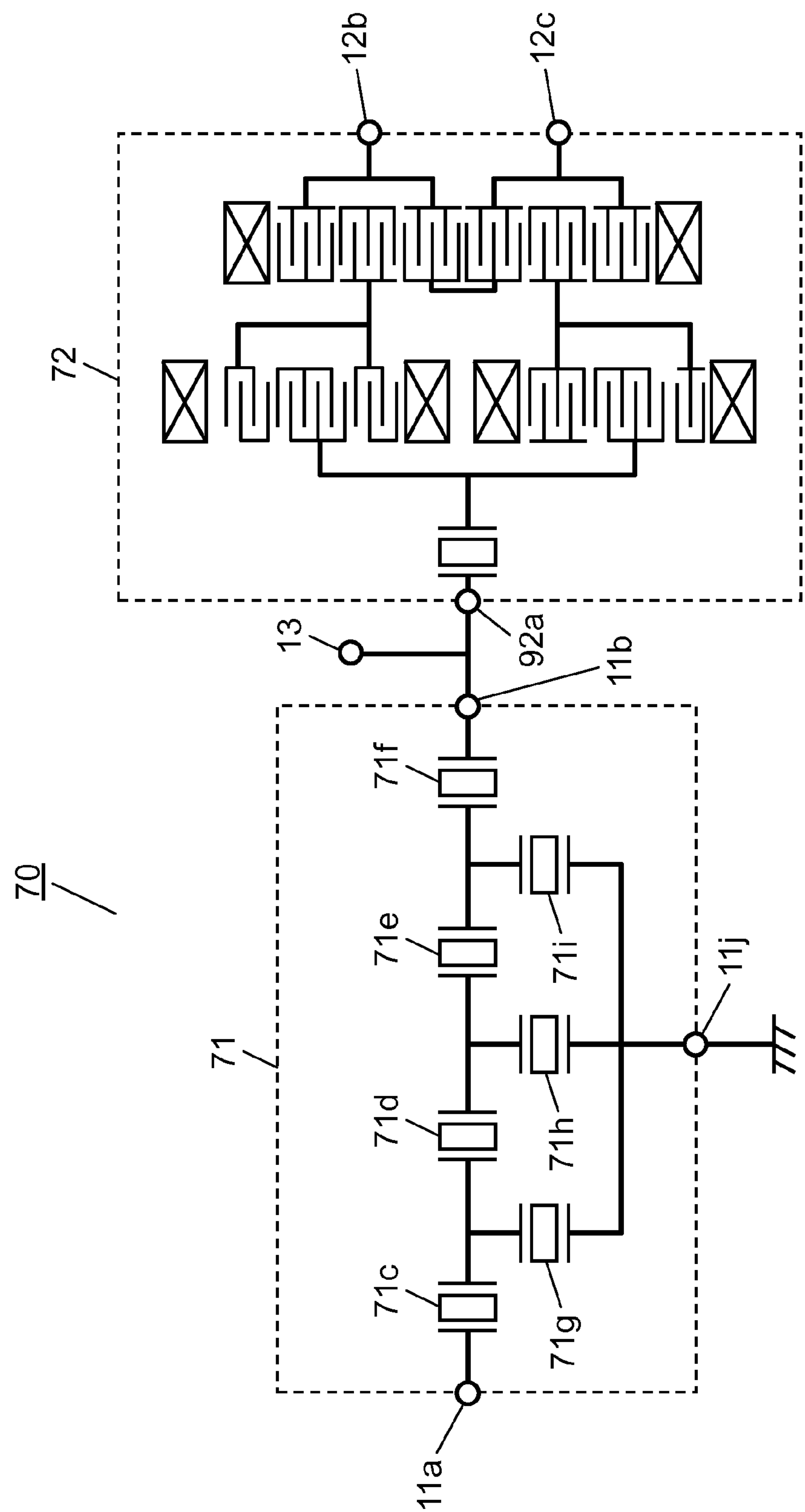
FIG. 7 is a block diagram of a duplexer according to a second exemplary embodiment.

FIG. 7 shows duplexer 70 for Band 2, where ladder-type transmission filter 71 and DMS reception filter 72 are connected to antenna terminal 13 similarly to duplexer 10 in FIG. 1.

The thickness of a dielectric film covering parallel elastic-wave resonators 71*g*, 71*h*, and 71*i* of transmission filter 71 is formed thinner than that with which the frequency-temperature characteristic becomes 0 to consciously make the frequency-temperature characteristic negative. Here, it is assumed that parallel elastic-wave resonator 71*i* with the lowest capacitance is a first parallel elastic-wave resonator; the others are second parallel elastic-wave resonators. This makes the frequency-temperature characteristic of parallel elastic-wave resonators 71g, 71h, and 71i negative to improve the passing characteristic at the left shoulder of the transmission characteristic at high temperature.

A description is made of the transmission characteristic of transmission filter 71 according to the second embodiment using FIG. 8

Figure 8A:
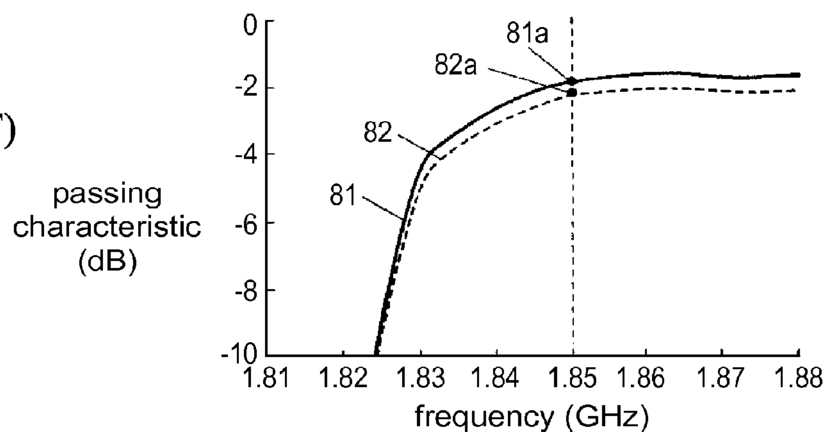
FIG. 8A illustrates a transmission characteristic of a conventional filter.

FIG. 8A shows conventional transmission characteristic 81 at room temperature (25° C.) and conventional transmission characteristic 82 at high temperature (85° C.). Conventional transmission characteristic 82 at high temperature exhibits a greater loss than conventional transmission characteristic 81 at room temperature due to the greater ohmic loss. Consequently, the passing characteristic of the transmission band at the low-frequency side is 1.9 dB (point 81a) at room temperature and deteriorates to 2.3 dB (point 82a) at high temperature.

Figure 8B:
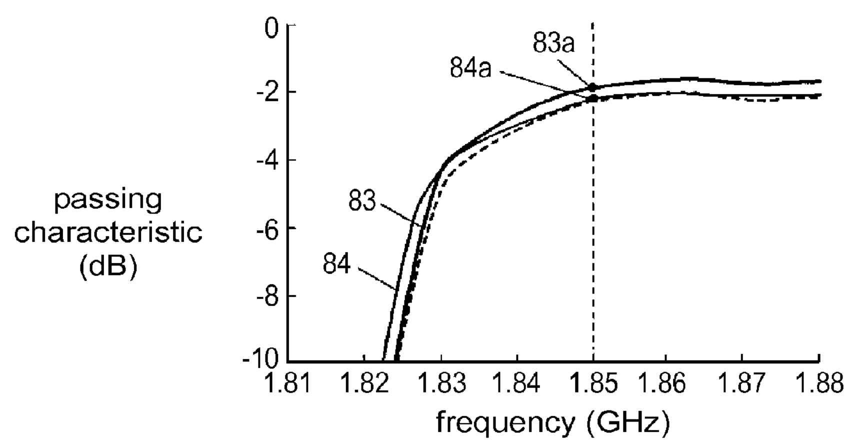
FIG. 8B illustrates a transmission characteristic of a transmission filter according to the second exemplary embodiment.

FIG. 8B shows transmission characteristic 83 at room temperature (25° C.) and transmission characteristic 84 at high temperature (85° C.), of transmission filter 71 according to the second embodiment. Similarly to FIG. 8A, transmission characteristic 84 at high temperature exhibits a greater loss than transmission characteristic 83 due to the greater ohmic loss. However, parallel elastic-wave resonators 71g, 71h, and 71i determining a transmission characteristic at the low-frequency side have a negative frequency-temperature characteristic. In other words, the thicknesses of dielectric films covering the first and second parallel elastic-wave resonators are respectively formed thinner than those with which the frequency-temperature characteristic becomes 0, and thus the frequency-temperature characteristic of the parallel elastic-wave resonator is negative. As a result, transmission characteristic 84 at high temperature shifts closer to the low-frequency side than transmission characteristic 83 at room temperature. Consequently, the passing characteristic at the low-frequency side of the transmission band is 1.9 dB (point 83a) at room temperature; and 2.2 dB (point 84a) at high temperature. In this way, transmission filter 71 according to the second embodiment is improved in the passing characteristic at the low-frequency side at high temperature as compared to a conventional transmission filter. In the second embodiment, three parallel elastic-wave resonators 71g through 71i are parallel-connect. However, the number of parallel elastic-wave resonators is not limited. For example, a composition of only first series elastic-wave resonators provides advantages in the same way. The number of first and second parallel elastic-wave resonators is not limited to the above-described example.

Figure 8C:
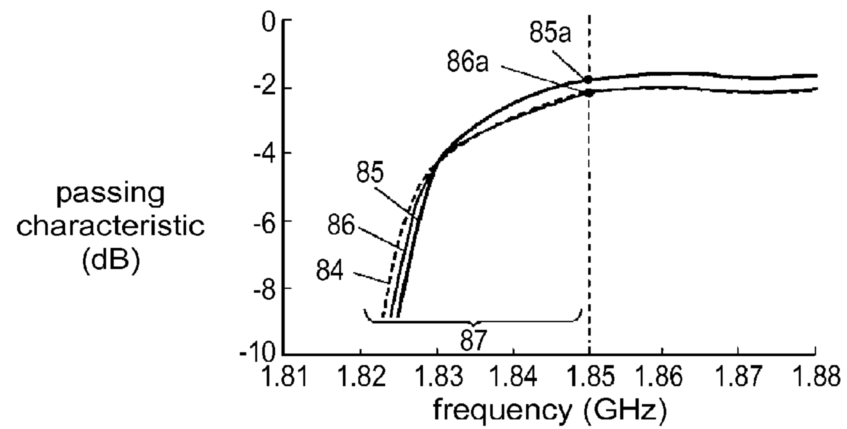
FIG. 8C illustrates a transmission characteristic of a transmission filter according to the second exemplary embodiment.

A description is made of another example according to the second embodiment using FIG. 8C. FIG. 8C shows transmission characteristic 85 at room temperature (25° C.) and transmission characteristic 86 at high temperature (85° C.) in a case where only the thickness of a dielectric film covering parallel elastic-wave resonator 71i (first parallel elastic-wave resonator) with the lowest capacitance out of parallel elastic-wave resonators 71g, 71h, and 71i included in transmission filter 71 is formed thinner than that with which the frequency-temperature characteristic becomes 0.

In FIG. 8C, transmission characteristic 86 at high temperature have passing characteristic 86a at the low-frequency side same as transmission characteristic 84 (shown by the dotted line in FIG. 8C) in FIG. 8B while having an increased attenuation amount in stop band 87. This is because, as the temperature rises, only the resonance frequency of parallel elastic-wave resonator 71i that most affects the left shoulder of the transmission characteristic shifts to the low-frequency side, and the resonance frequencies of the other parallel elastic-wave resonators 71g and 71h do not shift.

In FIG. 8C, the description is made assuming that parallel elastic-wave resonator 71i closest to antenna terminal 13 is a first parallel elastic-wave resonator with the lowest capacitance out of parallel elastic-wave resonators 71g, 71h, and 71i included in transmission filter 71, but not limited to this configuration. The following configuration may be used as well. That is, another parallel elastic-wave resonator has the lowest capacitance and the thickness of a dielectric film covering the parallel elastic-wave resonator is formed thicker than that with which the frequency-temperature characteristic becomes 0.

Here, the capacitance of an elastic-wave resonator can be adjusted according to the cross width of the electrode fingers of a comb-teeth electrode and the number of pairs of the electrode fingers.

A configuration of a duplexer using transmission filter 71 according to the second embodiment achieves a desired attenuation characteristic at frequencies lower than the transmission band and provides a duplexer with reduced deterioration in the transmission characteristic at high temperature.

As described in the first embodiment, the thickness of a dielectric film covering series elastic-wave resonators 71c, 71d, 71e, and 71f of transmission filter 71 may be formed thicker than that with which the frequency-temperature characteristic becomes 0. With this configuration, the right shoulder of the transmission band shifts to the high-frequency side, and the left shoulder of the transmission band shifts to the low-frequency side as the temperature rises. This prevents deterioration due to loss even if the ohmic loss increases as the temperature rises.

Transmission filter 71 according to the second embodiment can handle both a surface elastic wave propagating on the surface of a piezoelectric substrate and a boundary elastic wave propagating on the boundary surface of media with different velocities of wave propagation.

Third Exemplary Embodiment

One of the features in the third exemplary embodiment is described hereinafter with a difference from the first embodiment.

Figure 9:
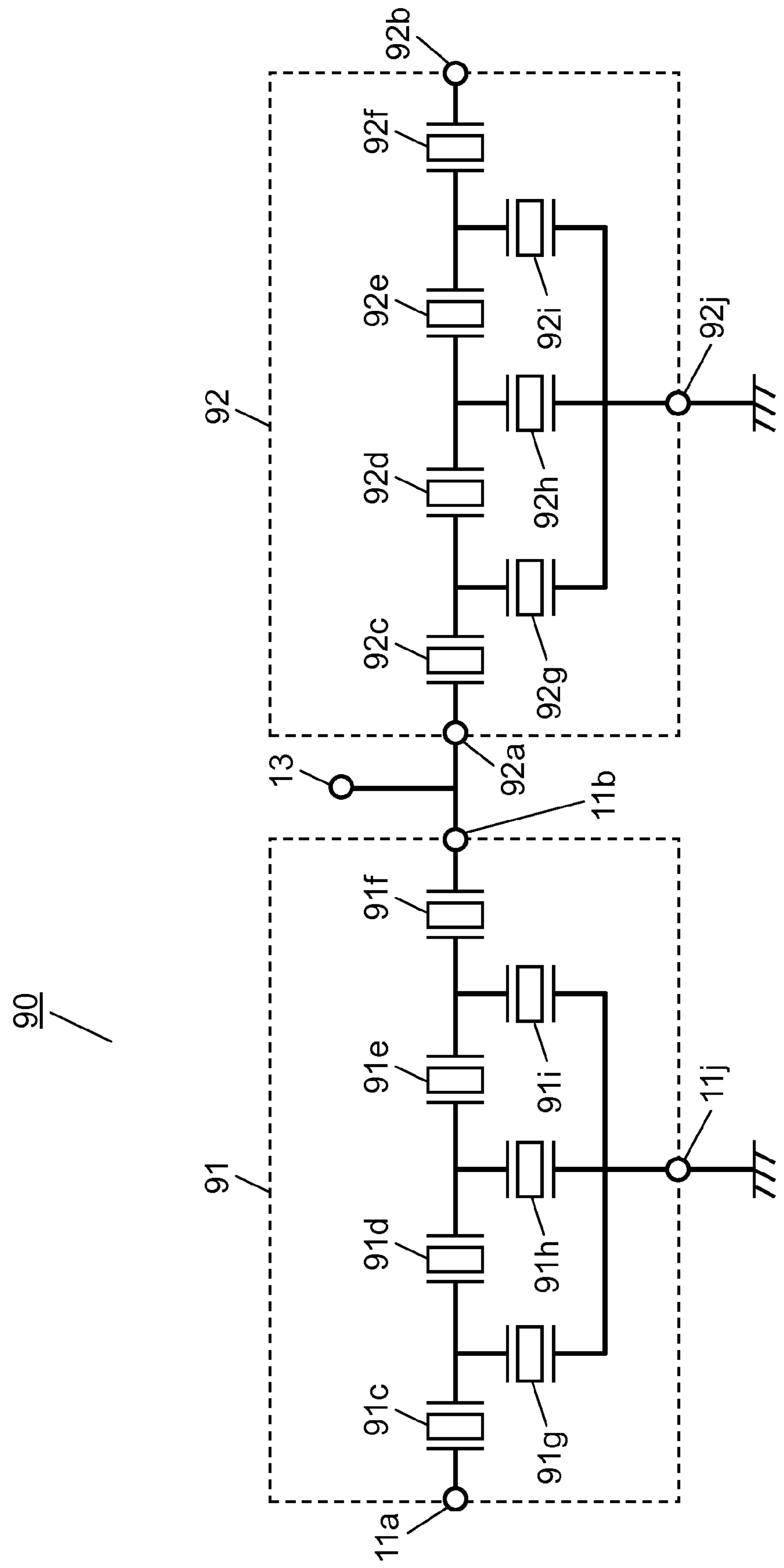
FIG. 9 is a block diagram of a duplexer according to the third embodiment.
Figure 10:
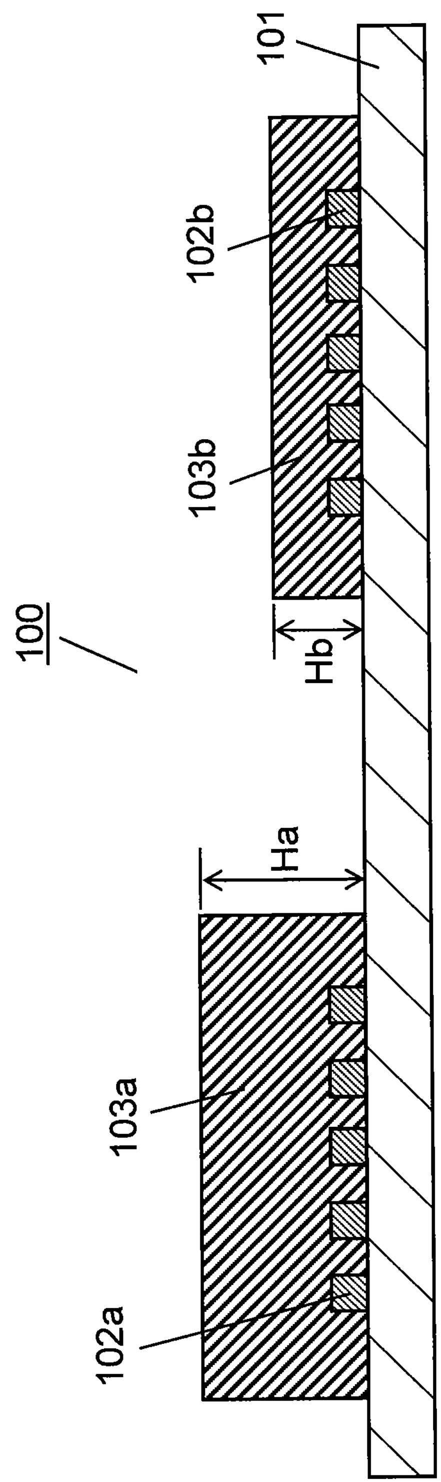
FIG. 10 illustrates a dielectric film covering a conventional elastic-wave resonator.

Duplexer 90 shown in FIG. 9 has ladder-type transmission filter 91 and ladder-type reception filter 92 connected to antenna terminal 13.

The thickness of a dielectric film covering parallel elastic-wave resonators 92g, 92h, and 92i of reception filter 92 is formed thinner than that with which the frequency-temperature characteristic becomes 0 to consciously make the frequency-temperature characteristic negative. This makes the frequency-temperature characteristic of parallel elastic-wave resonators 91g, 91h, and 91i negative to improve the passing characteristic at the left shoulder of the reception characteristic at high temperature.

Here, only the thickness of a dielectric film covering the parallel elastic-wave resonator with the lowest capacitance out of parallel elastic-wave resonators 92g, 92h, and 92i may be formed thinner than that with which the frequency-temperature characteristic becomes 0. This improves the passing characteristic at the left shoulder of the reception characteristic at high temperature while maintaining the attenuation characteristic of the crossband.

The thickness of a dielectric film covering series elastic-wave resonators 92c, 92d, 92e, and 92f of reception filter 92 may be formed thicker than that with which the frequency-temperature characteristic becomes 0 to consciously make the frequency-temperature characteristic positive. This makes the frequency-temperature characteristic of series elastic-wave resonators 92*c*, 92*d*, 92*e*, and 92*f* positive to improve the passing characteristic at the right shoulder of the reception characteristic at high temperature.

Here, only the thickness of a dielectric film covering the series elastic-wave resonator with the highest capacitance out of series elastic-wave resonators 92*c*, 92*d*, 92*e*, and 92*f* may be formed thicker than that with which the frequency-temperature characteristic becomes 0. This improves the passing characteristic at the right shoulder of the reception characteristic at high temperature while maintaining the attenuation characteristic at frequencies higher than the reception band.

Transmission filter 92 according to the third embodiment can handle both a surface elastic wave propagating on the surface of a piezoelectric substrate and a boundary elastic wave propagating on the boundary surface between media with different velocities of wave propagation.

REFERENCE MARKS IN THE DRAWINGS

10, 70, 90 Duplexer
11, 71, 91 Transmission filter
11*a*, 12*a* Input terminal
11*b*, 12*b*, 12*c* Output terminal
11*c*, 11*d*, 11*e*, 11*f* Series elastic-wave resonator
11*g*, 11*h*, 11*i* Parallel elastic-wave resonator
11*j*, 92*j* Ground terminal
12, 72, 92 Reception filter
13 Antenna terminal
21 Transmission characteristic
22 Reception characteristic
31 Piezoelectric substrate
32 Series elastic-wave resonator
33*a*, 33*b* Dielectric film
51, 52, 53, 54, 55, 56, 60 Transmission characteristic
71*c*, 71*d*, 71*e*, 71*f* Series elastic-wave resonator
71*g*, 71*h*, 71*i* Parallel elastic-wave resonator
81, 82, 83, 84, 85, 86 Transmission characteristic
92*c*, 92*d*, 92*e*, 92*f* Series elastic-wave resonator
92*g*, 92*h*, 92*i* Parallel elastic-wave resonator
100 Ladder-type elastic wave filter
101 Piezoelectric substrate
102*a* Series elastic-wave resonator
102*b* Parallel elastic-wave resonator
103*a*, 103*b* Dielectric film

The invention claimed is:

1. A ladder-type elastic wave filter comprising:

a piezoelectric substrate formed of a material with a negative temperature coefficient;

a first series elastic-wave resonator formed on the piezoelectric substrate and connected in series between an input terminal and an output terminal, the first series elastic-wave resonator having a first capacitance;

a second series elastic-wave resonator connected in series between the input terminal and the output terminal and having a second capacitance, the first capacitance of the first series elastic-wave resonator being higher than the second capacitance of the second series elastic-wave resonator;

a parallel elastic-wave resonator formed on the piezoelectric substrate and connected in parallel between the first series elastic-wave resonator and a ground terminal; and a dielectric film formed on the piezoelectric substrate the dielectric film covering the first series elastic-wave resonator and the second series elastic-wave resonator, the dielectric film formed of a material with a positive temperature coefficient, a thickness of the dielectric film being thicker than a film thickness with which a frequency-temperature coefficient of a passing characteristic of the first series elastic-wave resonator becomes 0.

2. The ladder-type elastic wave filter of claim 1, wherein the thickness of the dielectric film is formed thicker than a film thickness with which respective frequency-temperature coefficients of the passing characteristic of the first series elastic-wave resonator and the second series elastic-wave resonator become 0.

3. A duplexer comprising:

the ladder-type elastic wave filter of claim 1; and a filter through which a signal with a frequency higher than a passband of the ladder-type elastic wave filter passes.

4. The ladder-type elastic wave filter of claim 1 wherein a passband of the first series elastic-wave resonator shifts to a high frequency side as temperature rises.

5. The ladder-type elastic wave filter of claim 1 wherein the ladder-type elastic wave filter is configured to pass signals in a transmission band between 1.85 GHz and 1.91 GHz and suppress signals in a reception band between 1.93 GHz and 1.99 GHz.

6. The ladder-type elastic wave filter of claim 5 further comprising a reception filter configured to suppress signals in a transmission band between 1.85 GHz and 1.91 GHz and pass signals in a reception band between 1.93 GHz and 1.99 GHz.

7. The ladder-type elastic wave filter of claim 6 wherein the ladder-type elastic wave filter is a WCDMA standard compliant filter.

8. The ladder-type elastic wave filter of claim 1 further comprising an antenna terminal connected to an output terminal of the ladder-type elastic wave filter.

9. The ladder-type elastic wave filter of claim 1 wherein the parallel elastic-wave resonator is electrically connected between the first series elastic-wave resonator and the second series elastic-wave resonator.

10. The ladder-type elastic wave filter of claim 1 wherein the dielectric film includes a protrusion part formed on a top surface of the dielectric film.

11. The ladder-type elastic wave filter of claim 1 wherein the dielectric film includes silicon dioxide.

12. A ladder-type elastic wave filter comprising:

a piezoelectric substrate formed of a material with a negative temperature coefficient;

a series elastic-wave resonator formed on the piezoelectric substrate and connected in series between an input terminal and an output terminal;

a first parallel elastic-wave resonator formed on the piezoelectric substrate and connected in parallel between the series elastic-wave resonator and a ground terminal, the first parallel elastic-wave resonator having a first capacitance;

a second parallel elastic-wave resonator connected between the series elastic-wave resonator and the ground terminal and having a second capacitance, the first capacitance of the first parallel elastic-wave resonator being lower than the second capacitance of the second parallel elastic-wave resonator; and a dielectric film formed on the piezoelectric substrate, the dielectric film covering the first parallel elastic-wave resonator and the second parallel elastic-wave resonator, the dielectric film formed of a material with a positive temperature coefficient, a thickness of the dielectric film being thinner than a film thickness with which a frequency-temperature coefficient of a passing characteristic of the first parallel elastic-wave resonator becomes 0.

13. The ladder-type elastic wave filter of claim 12 wherein the thickness of the dielectric film is formed thinner than respective film thicknesses with which respective frequency-temperature coefficients of the passing characteristic of the first parallel elastic-wave resonator and the second parallel elastic-wave resonator become 0.

14. A duplexer comprising:

the ladder-type elastic wave filter of claim 12; and a filter through which a signal with a frequency lower than a passband of the ladder-type elastic wave filter passes.

15. The ladder-type elastic wave filter of claim 12 wherein the ladder-type elastic wave filter is configured to pass signals in a transmission band between 1.85 GHz and 1.91 GHz and suppress signals in a reception band between 1.93 GHz and 1.99 GHz.

16. The ladder-type elastic wave filter of claim 15 further comprising a reception filter configured to suppress signals in a transmission band between 1.85 GHz and 1.91 GHz and pass signals in a reception band between 1.93 GHz and 1.99 GHz.

17. The ladder-type elastic wave filter of claim 12 wherein a passband of the first parallel elastic-wave resonator shifts to a low frequency side as temperature increases.

18. The ladder-type elastic wave filter of claim 12 further comprising a second series elastic-wave resonator formed on the piezoelectric substrate and connected in series with the first series elastic-wave resonator between the first parallel elastic-wave resonator and the second parallel elastic-wave resonator.

19. The ladder-type elastic wave filter of claim 12 wherein a resonance frequency of the first parallel elastic-wave resonator shifts as temperature rises.

20. The ladder-type elastic wave filter of claim 19 wherein a resonance frequency of the second parallel elastic-wave resonator does not shift as temperature rises.

* * * * *